(12) United States Patent
Asai

(10) Patent No.: US 7,082,579 B2
(45) Date of Patent: Jul. 25, 2006

(54) GATED CLOCK GENERATING CIRCUIT AND METHOD OF MODIFYING THE CIRCUIT

(75) Inventor: Junki Asai, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/166,627

(22) Filed: Jun. 12, 2002

(65) Prior Publication Data

US 2002/0188911 A1    Dec. 12, 2002

(30) Foreign Application Priority Data

Jun. 12, 2001    (JP) .............................. 2001-176723

(51) Int. Cl.
*G06F 17/50* (2006.01)
(52) U.S. Cl. ..................... 716/1; 716/1; 716/6; 716/10
(58) Field of Classification Search .................... 716/1, 716/6, 10
See application file for complete search history.

(56) References Cited

U.S. PATENT DOCUMENTS

| 4,189,621 A | * | 2/1980 | Scott .......................... 375/239 |
| 4,368,514 A | * | 1/1983 | Persaud et al. ............. 709/211 |
| 5,111,480 A | | 5/1992 | Sarkoezi et al. |
| 5,315,181 A | | 5/1994 | Schowe et al. |
| 5,537,062 A | | 7/1996 | Mote, Jr. et al. |
| 5,808,486 A | | 9/1998 | Smiley et al. |
| 5,980,092 A | * | 11/1999 | Merryman et al. ............ 716/6 |

FOREIGN PATENT DOCUMENTS

| JP | 62-16615 A | 1/1987 |
| JP | 02-290322 | 11/1990 |
| JP | 2-290322 | 11/1990 |
| JP | 4-74206 | 3/1992 |
| JP | 08-330915 | 12/1996 |
| JP | 11-506885 | 6/1999 |

* cited by examiner

*Primary Examiner*—Chuong Anh Luu
(74) *Attorney, Agent, or Firm*—Birch, Stewart, Kolasch & Birch, LLP

(57) ABSTRACT

In a conventional gated clock generating circuit, different signal delay times are produced depending on the arrangement of interconnection of circuit elements, often causing glitches. To avoid this, a gated clock generating circuit of the invention has a circuit that generates a first gate signal having inversion points synchronous with edges of a continuously pulsating clock signal, a circuit that generates a second gate signal deviated by half the period of the clock signal relative to the first gate signal, and a circuit that turns on and off the output of the clock signal in accordance with the first and second gate signals. Even when inversion points of the first or second gate signal deviate from edges of the clock signal, no glitches result.

10 Claims, 14 Drawing Sheets

Fig. 12

```
   :
   :
process (a, b)                          ⎫
begin                                   ⎪
   if (a = b) then                      ⎪
      data_input_to_ff1 <= ' 1 ' ;      ⎬ A2
   else                                 ⎪
      data_input_to_ff1 <= ' 0 ' ;      ⎪
   endif;                               ⎪
end process;                            ⎭ process (res, clk1)                                      ⎫
begin                                                    ⎪
   if (res = ' 1 ' ) then                                ⎪
      gate1 <= ' 0 ' ;                                   ⎬ A3
   elsif (clk1 ' event and clk1 = ' 1 ' ) then           ⎪
      gate1 <= data_input_to_ff1;                        ⎪
   endif;                                                ⎪
end process;                                             ⎭ inv_clk1 <= not clk1;   ⎯⎯ B2 process (res, inv_clk1)                                          ⎫
begin                                                            ⎪
   if (res = ' 1 ' ) then                                        ⎪
      gate2 <= ' 0 ' ;                                            ⎬ A4
   elsif (inv_clk1 ' event and inv_clk1 = ' 1 ' ) then           ⎪
      gate2 <= data_input_to_ff1;                                ⎪
   endif;                                                        ⎪
end process;                                                     ⎭
   :
   :
gclk1_tmp <= gate1 and clk1;   ⎯⎯ B3 gclk1 <= gclk1_tmp and gate2;   ⎯⎯ B4
   :
   :
```

PRIOR ART
Fig. 20

```
         :
         :
process (res, clk1)
begin
    if (res = '1') then
        gate1 <= '0'
    elsif (clk1 'event and clk1 = '1') then
        if (a = b) then
            gate1 <= '1';
        else
            gate1 <= '0';
        endif;
    endif;
end process;
         :
         :
gclk1 <= gate1 and clk1;           B1
         :
         :
```

}A1

US 7,082,579 B2

GATED CLOCK GENERATING CIRCUIT AND METHOD OF MODIFYING THE CIRCUIT

BACKGROUND OF THE INVENTION

1. Field of the Invention

The present invention relates to a gated clock generating circuit that outputs a clock signal while turning it on and off.

2. Description of the Prior Art

In a semiconductor integrated circuit that operates in synchronism with a clock signal (hereinafter such a circuit will be referred to as a "clock-synchronous circuit"), too large a difference between the delay times with which the clock signal is fed to different flip-flops (hereinafter such a difference will be referred to as a "skew") causes a fault such as nonfunctioning or malfunctioning of the circuit. To avoid this, clock-synchronous circuits are generally given a synchronized design.

A synchronized design consists in feeding an external clock signal directly to the clock input terminals of flip-flops within a circuit without dividing, turning on or off, or inverting the clock signal inside the circuit, and in addition arranging circuit elements and interconnecting them (hereinafter referred to as "arrangement and interconnection") so as to minimize skews in the clock signal.

However, in a clock-synchronous circuit so designed, the clock signal is fed to all the flip-flops simultaneously all the time. This increases the electric power consumption of the flip-flops, and thus increases the electric power consumption of the clock-synchronous circuit as a whole.

One effective way proposed to reduce the electric power consumption of a clock-synchronous circuit is to provide it with a gated clock generating circuit so that a gated clock signal generated by the gated clock generating circuit is fed to the clock input terminals of flip-flops that need not operate under certain conditions.

FIGS. 14 and 16 show examples of the configuration of conventional gated clock generating circuits.

First, the gated clock generating circuit shown in FIG. 14 will be described. A clock signal CLK1 is received at an input terminal 1, which is connected through a buffer gate BUF1 to the input terminal of a buffer gate BUF2 and to the input terminal of a buffer gate BUF3.

The output terminal of the buffer gate BUF2 is connected to the clock input terminal of a flip-flop FF1. The output terminal of the buffer gate BUF3 is connected to the second input terminal of an AND gate AN1.

A data signal Data1 is received at an input terminal 2, which is connected to the data input terminal of the flip-flop FF1. The output terminal of the flip-flop FF1 is connected to the first input terminal of the AND gate AN1. The output terminal of the AND gate AN1 is connected to an output terminal 3, at which a gated clock signal GCLK1 is fed out.

Now, the operation of the gated clock generating circuit configured in this way will be described with reference to the circuit configuration diagram of FIG. 14 and a timing chart of FIG. 15A. The clock signal CLK1 received at the input terminal 1, through the buffer gate BUF1 and the buffer gate BUF2, reaches the clock input terminal of the flip-flop FF1. The data signal Data1 received at the input terminal 2 reaches the data input terminal of the flip-flop FF1. As a result, from the output terminal 1 of the flip-flop FF1 to the first input terminal of the AND gate AN1 is fed a gate signal Gate1, which has, as shown in FIG. 15A, a waveform having inversion points of the data signal Data1 delayed up to rising edges of the clock signal CLK1.

The clock signal CLK1 received at the input terminal 1 reaches the second input terminal of the AND gate AN1 as well. Thus, the AND gate AN1 outputs to the output terminal 3 the gated clock signal GCLK1, which is the AND of the gate signal Gate1 and the clock signal CLK1.

In this way, by designating with the input of the data signal the period in which the clock signal is needed, it is possible to output the clock signal only in the period in which it is needed, in the form of the gated clock signal GCLK1.

Next, the gated clock generating circuit shown in FIG. 16 will be described. A clock signal CLK2 is received at an input terminal 4, which is connected to the input terminal of an inverter INV2 and to the input terminal of a buffer gate BUF5.

The output terminal of the inverter INV2 is connected through a buffer gate BUF4 to the clock input terminal of a flip-flop FF3. The output terminal of the buffer gate BUF5 is connected to the second input terminal of an AND gate AN3.

A data signal Data2 is received at an input terminal 5, which is connected to the data input terminal of the flip-flop FF3. The output terminal of the flip-flop FF3 is connected to the first input terminal of the AND gate AN3. The output terminal of the AND gate AN3 is connected to an output terminal 6, at which a gated clock signal GCLK2 is fed out.

Now, the operation of the gated clock generating circuit configured in this way will be described with reference to the circuit configuration diagram of FIG. 16 and a timing chart of FIG. 17A. The clock signal CLK2 received at the input terminal 4 is inverted by the inverter INV2, and then, through the buffer gate BUF4, reaches the clock input terminal of the flip-flop FF3. The data signal Data2 received at the input terminal 5 reaches the data input terminal of the flip-flop FF3. As a result, from the output terminal of the flip-flop FF3 to the first input terminal of the AND gate AN3 is fed a gate signal Gate3, which has, as shown in FIG. 17A, a waveform having inversion points of the data signal Data2 delayed up to trailing edges of the clock signal CLK2.

The clock signal CLK2 received at the input terminal 4, through the buffer gate BUF5, reaches the second input terminal of the AND gate AN3 as well. Thus, the AND gate AN3 outputs to the output terminal 6 the gated clock signal GCLKC2, which is the AND of the gate signal Gate3 and the clock signal CLK2.

In this way, by designating with the input of the data signal the period in which the clock signal is needed, it is possible to output the clock signal only in the period in which it is needed, in the form of the gated clock signal GCLK2.

However, different delays are produced depending on arrangement and interconnection, and therefore an edge of the gate signal reaching the first input terminal of the AND gate outputting the gated clock signal does not necessarily coincides with the corresponding edge of the clock signal reaching the second input terminal of the same AND gate as shown in FIG. 15A or 17A.

For example, in the gated clock generating circuit shown in FIG. 14, if the clock signal CLK1 reaches the AND gate AN1 earlier than the gate signal Gate1 does, then, as shown in FIG. 15B, in the vicinity of an inversion points of the gate signal Gate1, there is created a period t1 in which the clock signal CLK1 and the gate signal Gate1 are simultaneously high. This produces a glitch in the gated clock signal GCLK1 in the period t1. By contrast, if the gate signal Gate1 reaches the AND gate AN1 earlier than the clock signal CLK1 does, then, as shown in FIG. 15C, in the vicinity of an inversion points of the gate signal Gate1, no period is created in which the clock signal CLK1 and the gate signal Gate1 are simultaneously high. Thus, no glitch is produced in the gated clock signal GCLK1.

On the other hand, in the gated clock generating circuit shown in FIG. 16, if the gate signal Gate3 reaches the AND gate AN3 earlier than the clock signal CLK2 does, then, as shown in FIG. 17C, in the vicinity of an inversion points of the gate signal Gate3, there is created a period t2 in which the clock signal CLK2 and the gate signal Gate3 are simultaneously high. This produces a glitch in the gated clock signal GCLK2 in the period t2. By contrast, if the clock signal CLK2 reaches the AND gate AN3 earlier than the gate signal Gate3 does, then, as shown in FIG. 17B, in the vicinity of an inversion points of the gate signal Gate3, no period is created in which the clock signal CLK2 and the gate signal Gate3 are simultaneously high. Thus, no glitch is produced in the gated clock signal GCLK2.

Such glitches in the gated clock signal may cause malfunctioning of the circuit to which it is fed. To avoid this, in a clock-synchronous circuit, after arrangement and interconnection, it is essential to check the delay times produced in the clock and gate signals before they reach the AND gate outputting the gated clock signal. If glitches are found to appear in the gated clock signal, it is inevitable to retry arrangement and interconnection, as by inserting redundant circuits, or even to redesign the whole circuit in order to adjust the delay times in the clock and gate signals.

SUMMARY OF THE INVENTION

An object of the present invention is to provide a gated clock generating circuit free from glitches.

To achieve the above object, according to the present invention, a gated clock generating circuit is provided with: a first gate signal generating circuit that receives a continuously pulsating clock signal and that generates a first gate signal having inversion points synchronous with edges of the clock signal; a second gate signal generating circuit that generates a second gate signal deviated by half the period of the clock signal relative to the first gate signal; and an output control circuit that turns on and off the output of the clock signal in accordance with the first and second gate signals.

BRIEF DESCRIPTION OF THE DRAWINGS

This and other objects and features of the present invention will become clear from the following description, taken in conjunction with the preferred embodiments with reference to the accompanying drawings in which:

FIG. 12 is a diagram showing a description in HDL representing the clock-synchronous circuit of FIG. 9;

FIG. 20 is a diagram showing a description in HDL representing the clock-synchronous circuit of FIG. 19.

DESCRIPTION OF THE PREFERRED EMBODIMENTS

Figure 1:
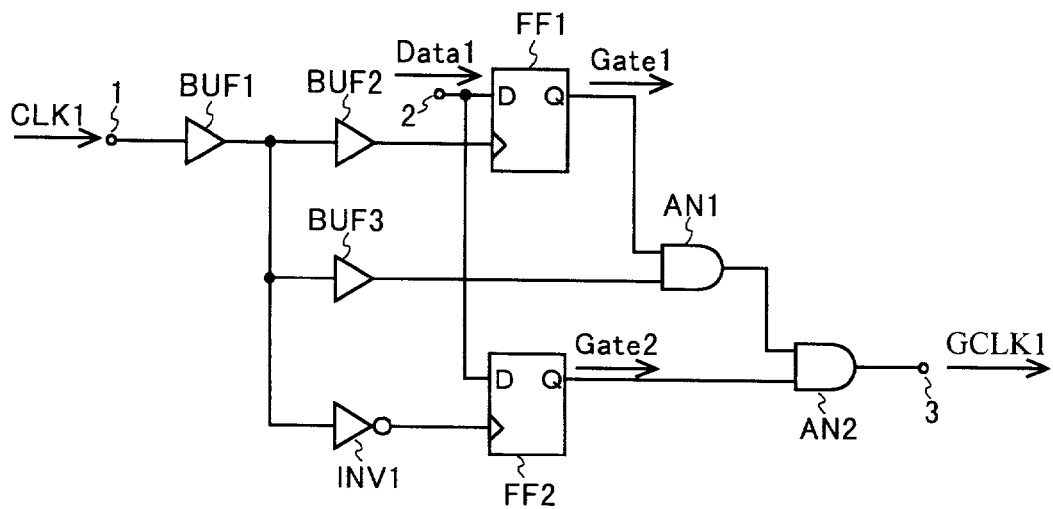
FIG. 1 is a diagram showing the configuration of the gated clock generating circuit of a first embodiment of the invention.
Figure 14:
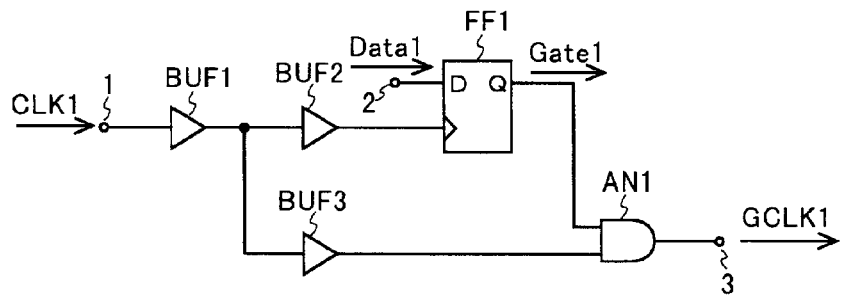
FIG. 14 is a diagram showing an example of the configuration of a conventional gated clock generating circuit.

Hereinafter, embodiments of the present invention will be described with reference to the drawings. FIG. 1 shows the configuration of the gated clock generating circuit of a first embodiment of the invention. It is to be noted that such circuit elements and signals as are found also in FIG. 14 are identified with the same symbols.

A clock signal CLK1 is received at an input terminal 1, which is connected through the buffer gate BUF1 to the input terminal of a buffer gate BUF2, to the input terminal of the buffer gate BUF3, and to the input terminal of an inverter INV1.

The output terminal of the buffer gate BUF2 is connected to the clock input terminal of a flip-flop FF1. The output terminal of the buffer gate BUF3 is connected to the second input terminal of an AND gate AN1. The output terminal of the inverter INV1 is connected to the clock input terminal of a flip-flop FF2.

A data signal Data1 is received at an input terminal 2, which is connected to the data input terminal of the flip-flop FF1 and to the data input terminal of the flip-flop FF2. The output terminal of the flip-flop FF1 is connected to the first input terminal of the AND gate AN1. The output terminal of the AND gate AN1 is connected to the first input terminal of an AND gate AN2. The output terminal of the flip-flop FF2 is connected to the second input terminal of the AND gate AN2. The output terminal of the AND gate AN2 is connected to an output terminal 3, at which a gated clock signal GCLK1 is fed out.

Figure 3:
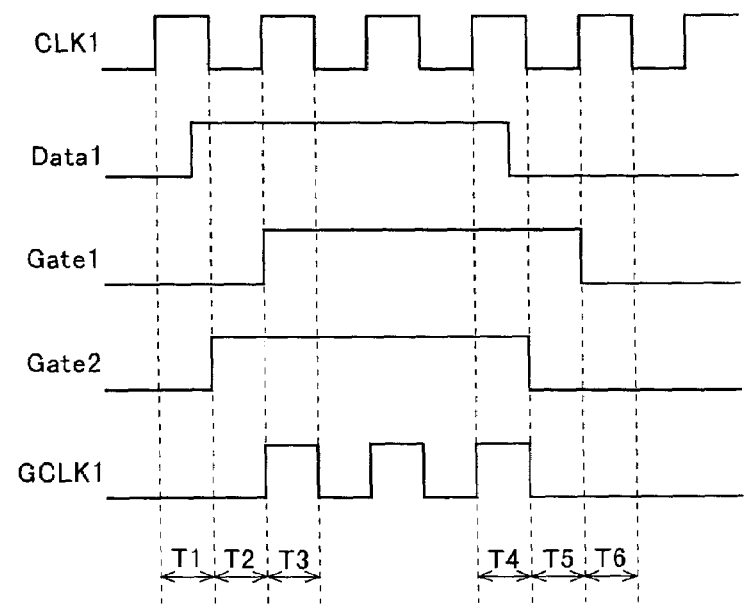
FIG. 3 is a timing chart showing the operation of the gated clock generating circuit of FIG. 1.
Figure 15A:
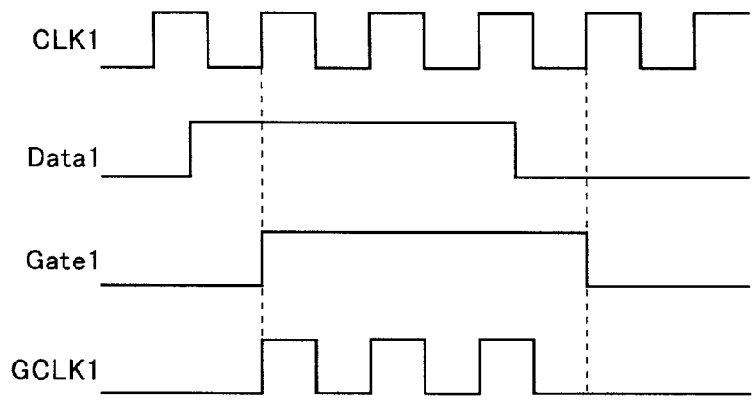
FIG. 15A is a timing chart showing the operation of the gated clock generating circuit of FIG. 14, in a case where the delay times in the gate and clock signals are equal.
Figure 15B:
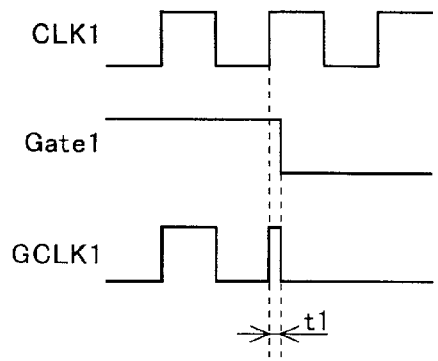
FIG. 15B is a timing chart showing the operation of the gated clock generating circuit of FIG. 14, in a case where the gate signal is delayed more than the clock signal.
Figure 15C:
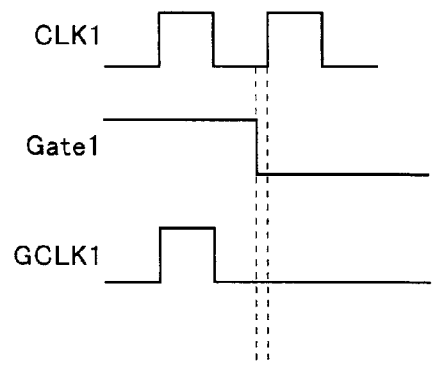
FIG. 15C is a timing chart showing the operation of the gated clock generating circuit of FIG. 14, in a case where the clock signal is delayed more than the gate signal.

Now, the operation of the gated clock generating circuit configured in this way will be described with reference to the circuit configuration diagram of FIG. 1 and a timing chart of FIG. 3. It is to be noted that the clock signal CLK1 and the data signal Data1 fed to the gated clock generating circuit shown in FIG. 1 have the same waveforms as those shown in FIG. 15A.

The clock signal CLK1 received at the input terminal 1, through the buffer gate BUF1 and the buffer gate BUF2, reaches the clock input terminal of the flip-flop FF1. The data signal Data1 received at the input terminal 2 reaches the data input terminal of the flip-flop FF1. As a result, from the output terminal of the flip-flop FF1 to the first input terminal of the AND gate AN1 is fed a gate signal Gate1, which has, as shown in FIG. 3, a waveform having inversion points of the data signal Data1 delayed up to rising edges of the clock signal CLK1.

The clock signal CLK1 received at the input terminal 1, through the buffer gate BUF3, reaches the second input terminal of the AND gate AN1 too. The AND gate AN1 outputs to the first input terminal of the AND gate AN2 a signal that is the AND of the gate signal Gate1 and the clock signal CLK1.

The clock signal CLK1 received at the input terminal 1, through the buffer gate BUF1 and the inverter INV1, reaches the clock input terminal of the flip-flop FF2 as well. The data signal Data1 received at the input terminal 2 reaches the data input terminal of the flip-flop FF2 as well. As a result, from the output terminal of the flip-flop FF2 to the second input terminal of the AND gate AN2 is fed a gate signal Gate2, which has, as shown in FIG. 3, a waveform having inversion points of the data signal Data1 delayed up to trailing edges of the clock signal CLK1.

The data signal Data1 fed to the data input terminal of the flip-flop FF1 is generated somewhere in a clock-synchronous circuit that incorporates the gated clock generating circuit of FIG. 1. Since the clock-synchronous circuit has a synchronized design, the data signal Data1 is a signal generated from a signal that changes states on rising edges of the clock signal CLK1. Therefore, the gate signal Gate2 output from the flip-flop FF2 is a signal advanced by half the period of the clock signal CLK1 relative to the gate signal Gate1.

As described above, the AND gate AN2 receives, at its first input terminal, a signal which is the AND of the gate signal Gate1 and the clock signal CLK1 and, at its second input terminal, the gate signal Gate2. Thus, the AND gate AN2 outputs to the output terminal 3 the gated clock signal GCLK1, which is the AND of the gate signal Gate1, the gate signal Gate2, and the clock signal CLK1. It is to be noted that the gate signal Gate1 and the gated clock signal GCLK1 have the same waveforms as those shown in FIG. 15A.

In this way, by designating with the input of the data signal the period in which the clock signal is needed, it is possible to output the clock signal only in the period in which it is needed, in the form of the gated clock signal GCLK1.

Figure 4:
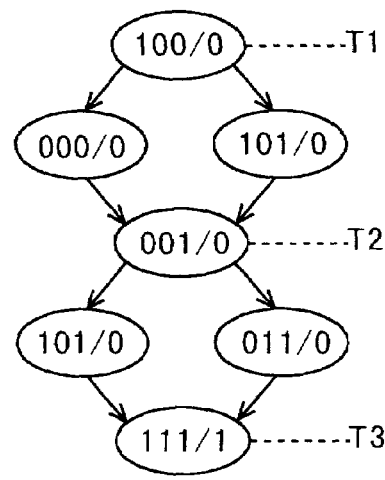
FIG. 4 is a diagram showing the state changes taking place in the periods T1 through T3 shown in FIG. 3.
Figure 5:
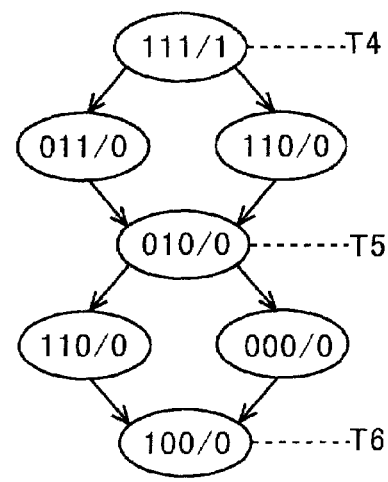
FIG. 5 is a diagram showing the state changes taking place in the periods T4 through T6 shown in FIG. 3.

The gated clock generating circuit of FIG. 1 is free from glitches, and now how this is achieved will be described. FIG. 4 shows the state changes of the input signals to the AND gate AN1 and the input and output signals to and from the AND gate AN2 in the periods T1, T2, and T3 shown in FIG. 3. FIG. 5 shows the state changes of the input signals to the AND gate AN1 and the input and output signals to and from the AND gate AN2 in the periods T4, T5, and T6 shown in FIG. 3. In FIGS. 4 and 5, in each circle are indicated, from left, the logic state of the clock signal CLK1, the logic state of the gate signal Gate1, the logic state of the gate signal Gate2, and then, on the right of the symbol "/," the output state of the AND gate AN2, i.e., the logic state of the gated clock signal GCLK1.

First, FIG. 4 will be described. In the period T1, the states are "100/0." In the transition from the period T1 to the period T2, the clock signal CLK1 and the gate signal Gate2 are inverted, so that the states eventually change to "001/0." Here, depending on arrangement and interconnection in the gated clock generating circuit, the states can change in one of the following two ways: if the clock signal CLK1 is inverted earlier than the gate signal Gate2, the states change from "100/0" to "000/0" to "001/0"; if the gate signal Gate2 is inverted earlier than the clock signal CLK1, the states change from "100/0" to "101/0" to "001/0."

In whichever way the states may change, the logic state of the gated clock signal GCLK1 remains "0." Thus, in the transition from the period T1 to the period T2, no glitch appears in the gated clock signal GCLK1.

In the period T2, the states are "001/0." In the transition from the period T2 to the period T3, the clock signal CLK1 and the gate signal Gate1 are inverted, so that the states eventually change to "111/1." Here, depending on arrangement and interconnection in the gated clock generating circuit, the states can change in one of the following two ways: if the clock signal CLK1 is inverted earlier than the gate signal Gate1, the states change from "001/0" to "101/0" to "111/1"; if the gate signal Gate1 is inverted earlier than the clock signal CLK1, the states change from "001/0" to "011/0" to "111/1."

In whichever way the states may change, the logic state of the gated clock signal GCLK1 changes from "0" to "1" only once before the period T3 has started. Thus, in the transition from the period T2 to the period T3, no glitch appears in the gated clock signal GCLK1.

Next, FIG. 5 will be described. In the period T4, the states are "111/1." In the transition from the period T4 to the period T5, the clock signal CLK1 and the gate signal Gate2 are inverted, so that the states eventually change to "010/0." Here, depending on arrangement and interconnection in the gated clock generating circuit, the states can change in one of the following two ways: if the clock signal CLK1 is inverted earlier than the gate signal Gate2, the states change from "111/1" to "011/0" to "010/0"; if the gate signal Gate2 is inverted earlier than the clock signal CLK1, the states change from "111/1" to "110/0" to "010/0."

In whichever way the states may change, the logic state of the gated clock signal GCLK1 changes from "1" to "0" only once and thereafter remains "0." Thus, in the transition from the period T4 to the period T5, no glitch appears in the gated clock signal GCLK1.

In the period T5, the states are "010/0." In the transition from the period T5 to the period T6, the clock signal CLK1 and the gate signal Gate1 are inverted, so that the states eventually change to "100/0." Here, depending on arrangement and interconnection in the gated clock generating circuit, the states can change in one of the following two ways: if the clock signal CLK1 is inverted earlier than the gate signal Gate1, the states change from "010/0" to "110/0" to "100/0"; if the gate signal Gate1 is inverted earlier than the clock signal CLK1, the states change from "010/0" to "000/0" to "100/0."

In whichever way the states may change, the logic state of the gated clock signal GCLK1 remains "0" Thus, in the transition from the period T5 to the period T6, no glitch appears in the gated clock signal GCLK1.

In this way, the gated clock generating circuit of FIG. 1 produces no glitches. This prevents malfunctioning of a circuit that is fed with the gated clock signal output from the gated clock generating circuit of FIG. 1. Thus, there is no need to retry arrangement and interconnection, as by inserting redundant circuits, or redesign the whole circuit in order to adjust delay times.

Figure 2:
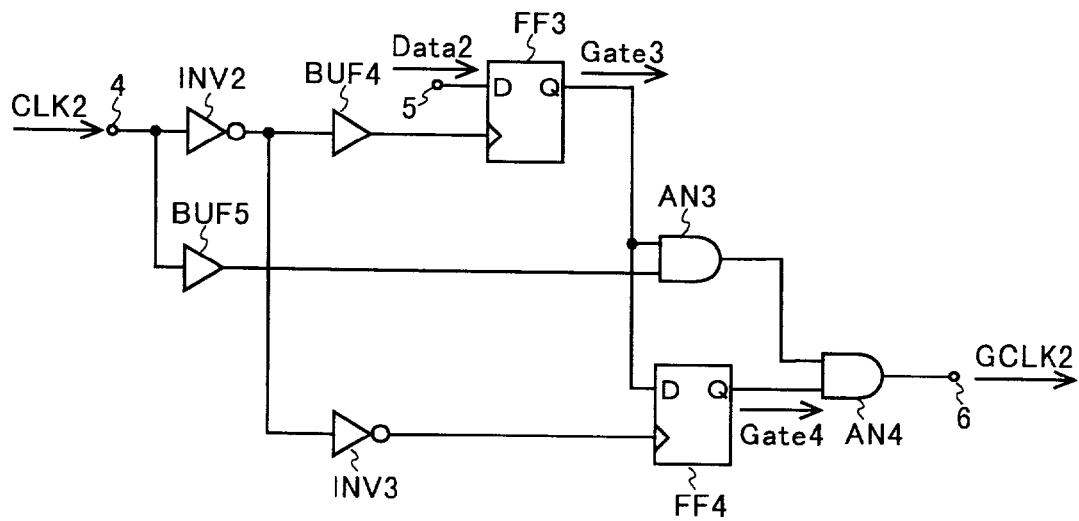
FIG. 2 is a diagram showing the configuration of the gated clock generating circuit of a second embodiment of the invention.
Figure 16:
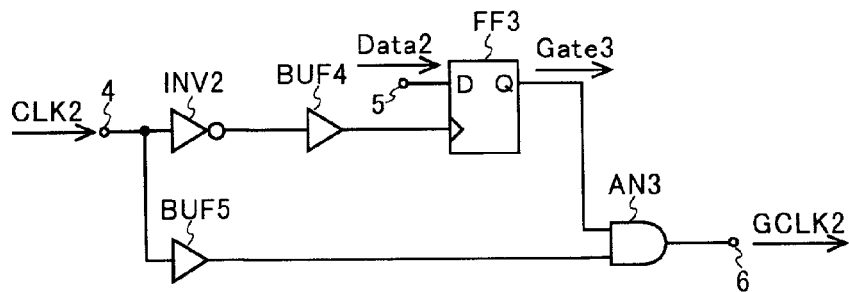
FIG. 16 is a diagram showing another example of the configuration of a conventional gated clock generating circuit.

FIG. 2 shows the configuration of the gated clock generating circuit of a second embodiment of the invention. It is to be noted that such circuit elements and signals as are found also in FIG. 16 are identified with the same symbols.

A clock signal CLK2 is received at an input terminal 4, which is connected to the input terminal of an inverter INV2 and to the input terminal of a buffer gate BUF5.

The output terminal of the inverter INV2 is connected to the input terminal of a buffer gate BUF4 and to the input terminal of an inverter INV3. The output terminal of the buffer gate BUF5 is connected to the second input terminal of an AND gate AN3.

The output terminal of the buffer gate BUF4 is connected to the clock input terminal of a flip-flop FF3. The output terminal of the inverter INV3 is connected to the clock input terminal of a flip-flop FF4.

A data signal Data2 is received at an input terminal 5, which is connected to the data input terminal of the flip-flop FF3. The output terminal of the flip-flop FF3 is connected to the first input terminal of the AND gate AN3 and to the data input terminal of the flip-flop FF4. The output terminal of the AND gate AN3 is connected to the first input terminal of an AND gate AN4. The output terminal of the flip-flop FF4 is connected to the second input terminal of the AND gate AN4. The output terminal of the AND gate AN4 is connected to an output terminal 6, at which a gated clock signal GCLK2 is fed out.

Figure 6:
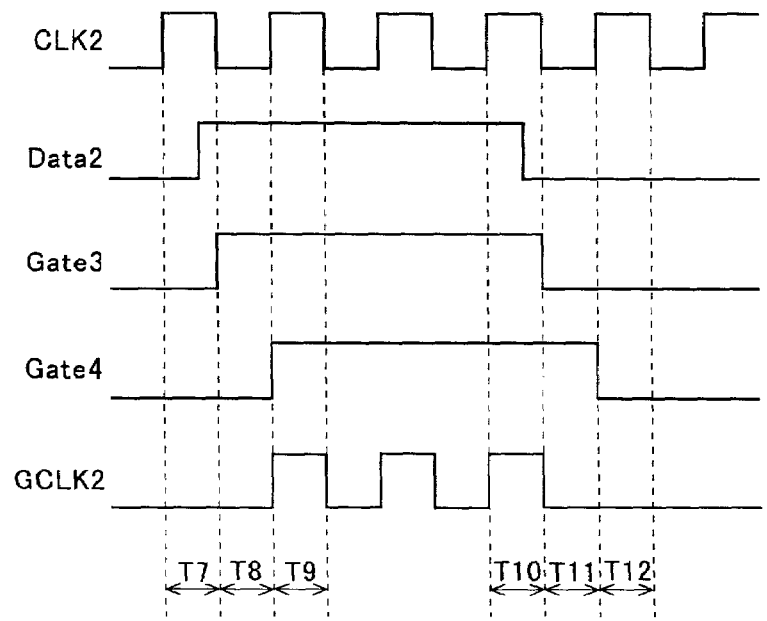
FIG. 6 is a timing chart showing the operation of the gated clock generating circuit of FIG. 2.

Now, the operation of the gated clock generating circuit configured in this way will be described with reference to the circuit configuration diagram of FIG. 2 and a timing chart of FIG. 6. The clock signal CLK2 received at the input terminal 4 is inverted by the inverter INV2, and then, through the buffer gate BUF4, reaches the clock input terminal of the flip-flop FF3. The data signal Data2 received at the input terminal 5 reaches the data input terminal of the flip-flop FF3. As a result, from the output terminal of the flip-flop FF3 to the first input terminal of the AND gate AN3 is fed a gate signal Gate3, which has, as shown in FIG. 6, a waveform having inversion points of the data signal Data2 delayed up to trailing edges of the clock signal CLK2.

The clock signal CLK2 received at the input terminal 4, through the buffer gate BUF5, reaches the second input terminal of the AND gate AN3 too. The AND gate AN3 outputs to the first input terminal of the AND gate AN4 a signal that is the AND of the gate signal Gate3 and the clock signal CLK2.

The clock signal CLK2 received at the input terminal 4, through the inverters INV2 and INV3, reaches the clock input terminal of the flip-flop FF4 as well. The gate signal Gate3 output from the output terminal of the flip-flop FF3 reaches the data input terminal of the flip-flop FF4. As a result, from the output terminal of the flip-flop FF4 to the second input terminal of the AND gate AN4 is fed a gate signal Gate4, which has a waveform having inversion points of the gate signal Gate3 delayed up to rising edges of the clock signal CLK2.

The gate signal Gate4 output from the flip-flop FF4 is a delayed version of the gate signal Gate3 output from the flip-flop FF3, and therefore the gate signal Gate4 output from the flip-flop FF4 is a signal delayed by half the period of the clock signal CLK1 relative to the gate signal Gate3 output from the flip-flop FF3.

Figure 17A:
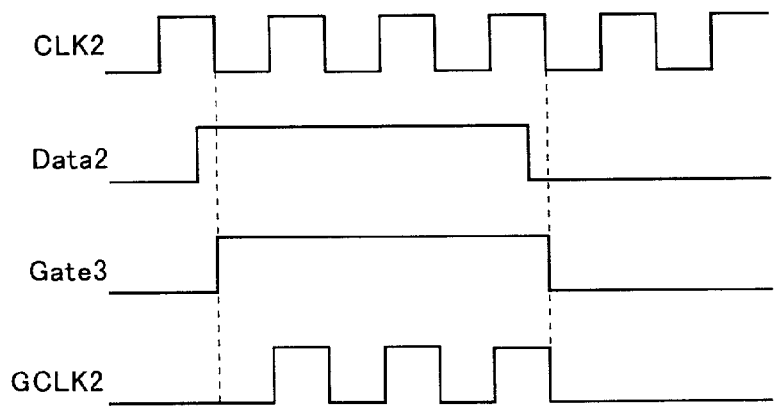
FIG. 17A is a timing chart showing the operation of the gated clock generating circuit of FIG. 16 in a case where the delay times in the gate and clock signals are equal.
Figure 17B:
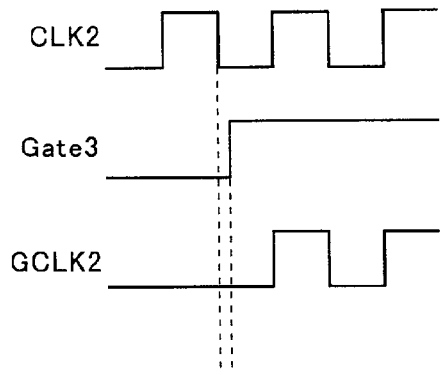
FIG. 17B is a timing chart showing the operation of the gated clock generating circuit of FIG. 16, in a case where the gate signal is delayed more than the clock signal.
Figure 17C:
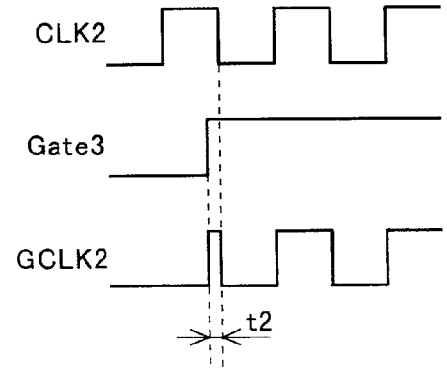
FIG. 17C is a timing chart showing the operation of the gated clock generating circuit of FIG. 16, in a case where the clock signal is delayed more than the gate signal.

As described above, the AND gate AN4 receives, at its first input terminal, a signal which is the AND of the gate signal Gate3 and the clock signal CLK2 and, at its second input terminal, the gate signal Gate4. Thus, the AND gate AN4 outputs to the output terminal 6 the gated clock signal GCLK2, which is the AND of the gate signal Gate3, the gate signal Gate4, and the clock signal CLK2. It is to be noted that the gate signal Gate3 and the gated clock signal GCLK2 have the same waveforms as those shown in FIG. 17A.

In this way, by designating with the input of the data signal the period in which the clock signal is needed, it is possible to output the clock signal only in the period in which it is needed, in the form of the gated clock signal GCLK2.

Figure 7:
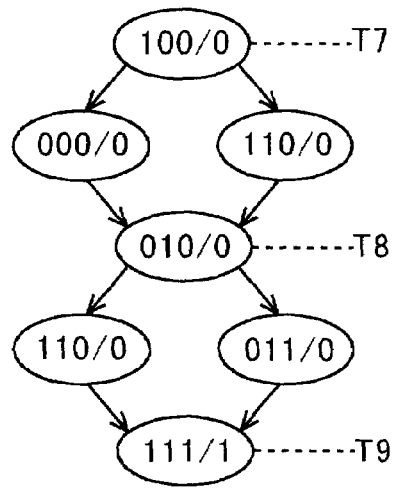
FIG. 7 is a diagram showing the state changes taking place in the periods T7 through T9 shown in FIG. 6.
Figure 8:
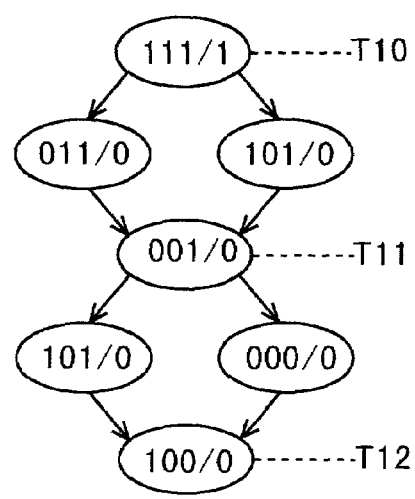
FIG. 8 is a diagram showing the state changes taking place in the periods T10 through T12 shown in FIG. 6.

The gated clock generating circuit of FIG. 2 is free from glitches, and now how this is achieved will be described. FIG. 7 shows the state changes of the input signals to the AND gate AN3 and the input and output signals to and from the AND gate AN4 in the periods T7, T8, and T9 shown in FIG. 6. FIG. 8 shows the state changes of the input signals to the AND gate AN3 and the input and output signals to and from the AND gate AN4 in the periods T10, T11, and T12 shown in FIG. 6. In FIGS. 7 and 8, in each circle are indicated, from left, the logic state of the clock signal CLK2, the logic state of the gate signal Gate3, the logic state of the gate signal Gate4, and then, on the right of the symbol "/," the output state of the AND gate AN4, i.e., the logic state of the gated clock signal GCLK2.

First, FIG. 7 will be described. In the period T7, the states are "100/0." In the transition from the period T7 to the period T8, the clock signal CLK2 and the gate signal Gate3 are inverted, so that the states eventually change to "010/0." Here, depending on arrangement and interconnection in the gated clock generating circuit, the states can change in one of the following two ways: if the clock signal CLK2 is inverted earlier than the gate signal Gate3, the states change from "100/0" to "000/0" to "010/0"; if the gate signal Gate3 is inverted earlier than the clock signal CLK2, the states change from "100/0" to "110/0" to "010/0."

In whichever way the states may change, the logic state of the gated clock signal GCLK2 remains "0." Thus, in the transition from the period T7 to the period T8, no glitch appears in the gated clock signal GCLK2.

In the period T8, the states are "010/0." In the transition from the period T8 to the period T9, the clock signal CLK2 and the gate signal Gate4 are inverted, so that the states eventually change to "111/1." Here, depending on arrangement and interconnection in the gated clock generating circuit, the states can change in one of the following two ways: if the clock signal CLK2 is inverted earlier than the gate signal Gate4, the states change from "010/0" to "110/0" to "111/1"; if the gate signal Gate4 is inverted earlier than the clock signal CLK2, the states change from "010/0" to "011/0" to "111/1."

In whichever way the states may change, the logic state of the gated clock signal GCLK2 changes from "0" to "1" only once before the period T9 has started. Thus, in the transition from the period T8 to the period T9, no glitch appears in the gated clock signal GCLK2.

Next, FIG. 8 will be described. In the period T10, the states are "111/1." In the transition from the period T10 to the period T11, the clock signal CLK2 and the gate signal Gate3 are inverted, so that the states eventually change to "001/0." Here, depending on arrangement and interconnection in the gated clock generating circuit, the states can change in one of the following two ways: if the clock signal CLK2 is inverted earlier than the gate signal Gate3, the states change from "111/1" to "011/0" to "001/0"; if the gate signal Gate3 is inverted earlier than the clock signal CLK2, the states change from "111/1" to "101/0" to "001/0."

In whichever way the states may change, the logic state of the gated clock signal GCLK2 changes from "1" to "0" only once and thereafter remains "0." Thus, in the transition from the period T10 to the period T11, no glitch appears in the gated clock signal GCLK2.

In the period T11, the states are "001/0." In the transition from the period T11 to the period T12, the clock signal CLK2 and the gate signal Gate4 are inverted, so that the states eventually change to "100/0." Here, depending on arrangement and interconnection in the gated clock generating circuit, the states can change in one of the following two ways: if the clock signal CLK2 is inverted earlier than the gate signal Gate4, the states change from "001/0" to "101/0" to "100/0"; if the gate signal Gate4 is inverted earlier than the clock signal CLK2, the states change from "001/0" to "000/0" to "100/0."

In whichever way the states may change, the logic state of the gated clock signal GCLK2 remains "0." Thus, in the transition from the period T11 to the period T12, no glitch appears in the gated clock signal GCLK2.

In this way, the gated clock generating circuit of FIG. 2 produces no glitches. This prevents malfunctioning of a circuit that is fed with the gated clock signal output from the gated clock generating circuit of FIG. 2. Thus, there is no need to retry arrangement and interconnection, as by inserting redundant circuits, or redesign the whole circuit in order to adjust delay times.

As described earlier, clock-synchronous circuits are generally given a synchronized design. In a synchronized design that uses not only an external clock signal as it is but also an inverted clock signal obtained by inverting that external clock signal, arrangement and interconnection need to be done counting the inverted clock signal as another clock signal. An increased number, like this, of clock signals in which skews need to be minimized not only make arrangement and interconnection difficult, but also increase the number of buffer gates to and from which the clock signals are input and output. This increases the area of the chip on which the clock-synchronous circuit is mounted, and thus increases costs.

Figure 18A:
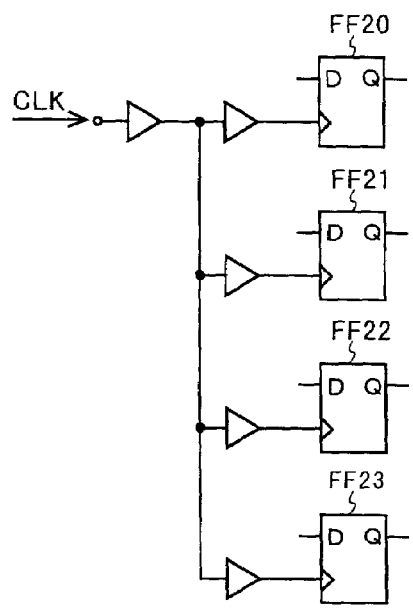
FIGS. 18A, 18B, and 18C are diagrams showing the configuration of a clock-synchronous circuit.
Figure 18B:
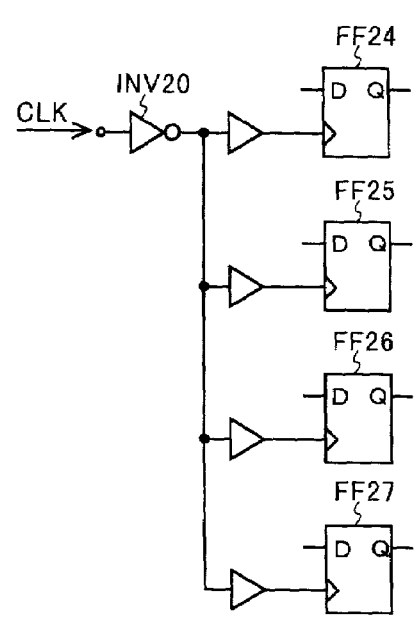
Figure 18C:
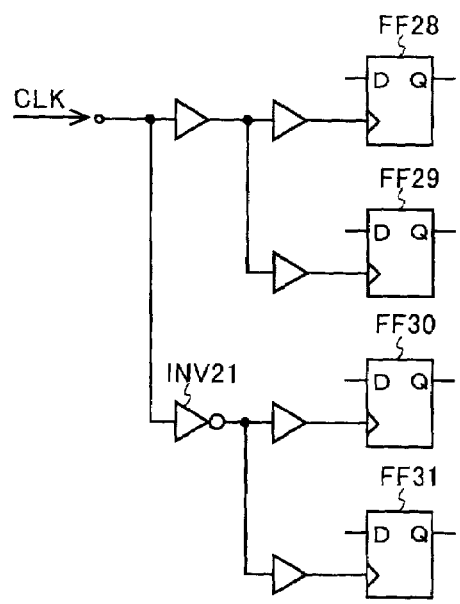

To avoid this, it is preferable to design a clock-synchronous circuit not as shown in FIG. 18C, where the clock signals fed to flip-flops FF28 to FF31 are grouped into two types, but as shown in FIG. 18A, where the clock signals fed to flip-flops FF20 to FF23 are of a single type, or as shown in FIG. 18B, where also the clock signals fed to flip-flops FF24 to FF27 are of a single type.

In the clock-synchronous circuit shown in FIG. 18A, the clock signals fed to the flip-flops FF20 to FF23 are of a single type because a clock signal CLK is fed to all the flip-flops FF20 to FF23 directly, i.e. without being passed through an inverter. In the clock-synchronous circuit shown in FIG. 18B, the clock signals fed to the flip-flops FF24 to FF27 are of a single type because a clock signal CLK is fed to all the flip-flops FF24 to FF27 through an inverter INV20. In the clock-synchronous circuit shown in FIG. 18C, a clock signal CLK is fed to the flip-flops FF28 and 29 without being passed through an inverter and to the flip-flops FF30 and FF31 through an inverter INV21; thus, the clock signals fed to the flip-flops FF28 to FF31 are grouped into two types.

Figure 9:
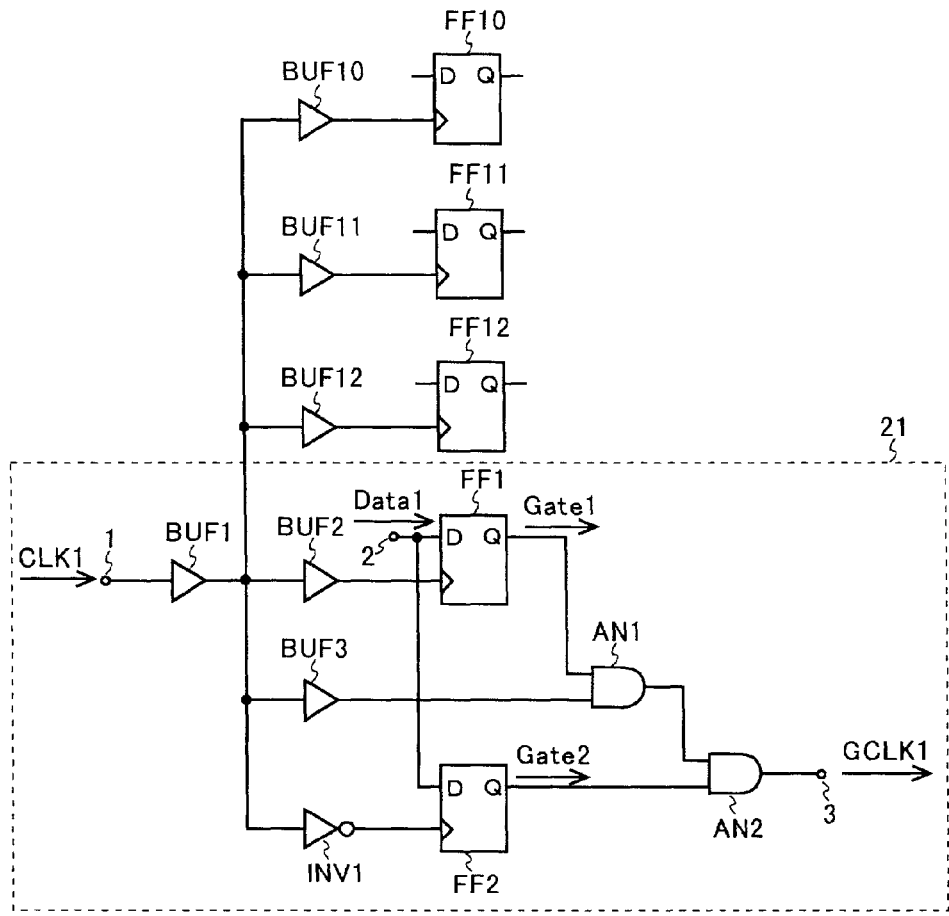
FIG. 9 is a diagram showing the circuit configuration of a clock-synchronous circuit incorporating the gated clock generating circuit of the FIG. 1.

When one of the gated clock generating circuits of the invention described above, for example that shown in FIG. 1, is incorporated in a clock-synchronous circuit, the overall circuit configuration will be as shown in FIG. 9. It is to be noted that, in FIG. 9, such circuit elements and signals as are found also in FIG. 1 are identified with the same symbols.

Conventionally, the clock-synchronous circuit of FIG. 9 needs to be designed counting the clock signal fed to the flip-flop FF2 as a separate clock signal. This makes it difficult for the designer to give a synchronized design to a clock-synchronous circuit incorporating a gated clock generating circuit according to the invention.

To overcome the difficulty, it is advisable to first design a clock-synchronous circuit using a conventional gated clock generating circuit, and then modify the clock-synchronous circuit so that its portion corresponding to the conventional gated clock generating circuit is altered into a gated clock generating circuit according to the invention. Now, how this is achieved will be described specifically.

Figure 10:
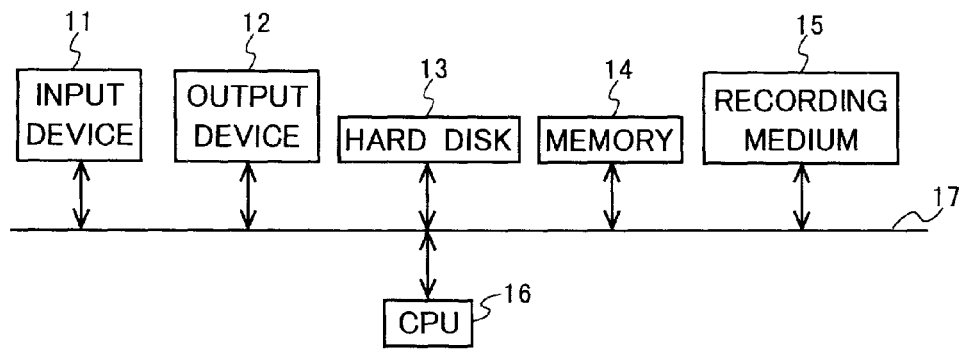
FIG. 10 is a diagram showing the configuration of a circuit modifying apparatus.

FIG. 10 shows a circuit modifying apparatus for modifying a clock-synchronous circuit so that a conventional gated clock generating circuit incorporated in it is altered into a gated clock generating circuit according to the invention. The circuit modifying apparatus of FIG. 10 is provided with an input device 11 to which input data is fed such as circuit diagram information or a net list, or a description in hardware description language (herein referred to as "HDL"), an output device 12 that outputs the modified result, a hard disk 13 on which the input data and the modified result are stored, a memory 14 in which data necessary to execute modification is held, a recording medium 15 on which a program for executing modification is recorded, and a CPU (central processor unit) 16 that executes modification according to the program recorded on the recording medium 15. The CPU 16 is connected through a bus 17 to the input device 11, output device 12, hard disk 13, memory 14, and recording medium 15.

The CPU 16 reads the program recorded on the recording medium 15, and, according to the program, executes the procedure described later. The data stored in the memory 14 beforehand includes data of the circuit information and net list of circuit elements to be added to the input data and data of the description in HDL representing the circuit elements to be added to the input data.

Now, the procedure executed by the circuit modifying apparatus of FIG. 10 when it is fed with a net list will be described with reference to the configuration diagram of FIG. 10 and a flow chart in FIGS. 11A and 11B.

Figure 11A:
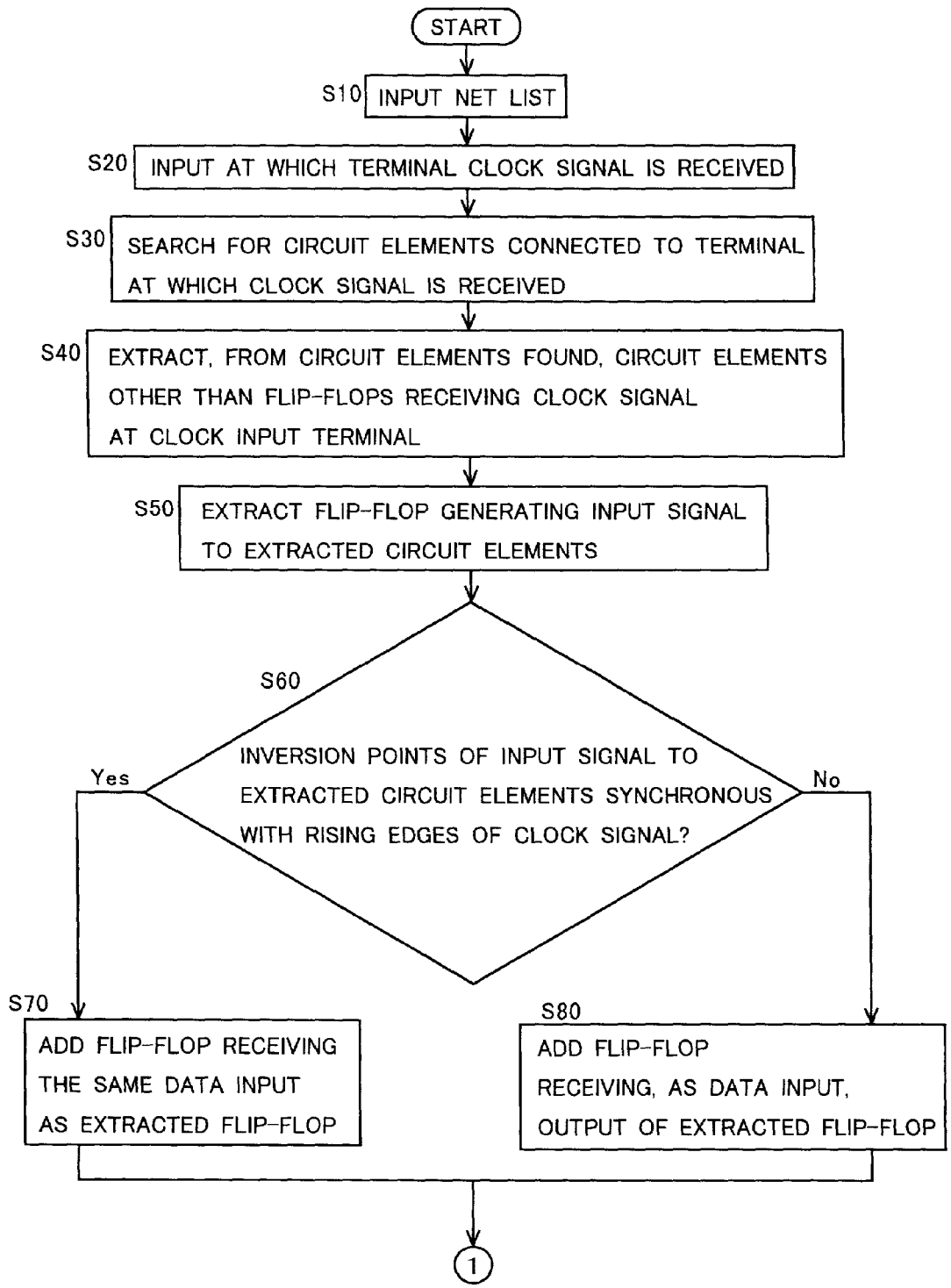
FIG. 11A is a flow chart of the procedure for modifying the net list, showing its portion up to the step of adding a flip-flop.
Figure 19:
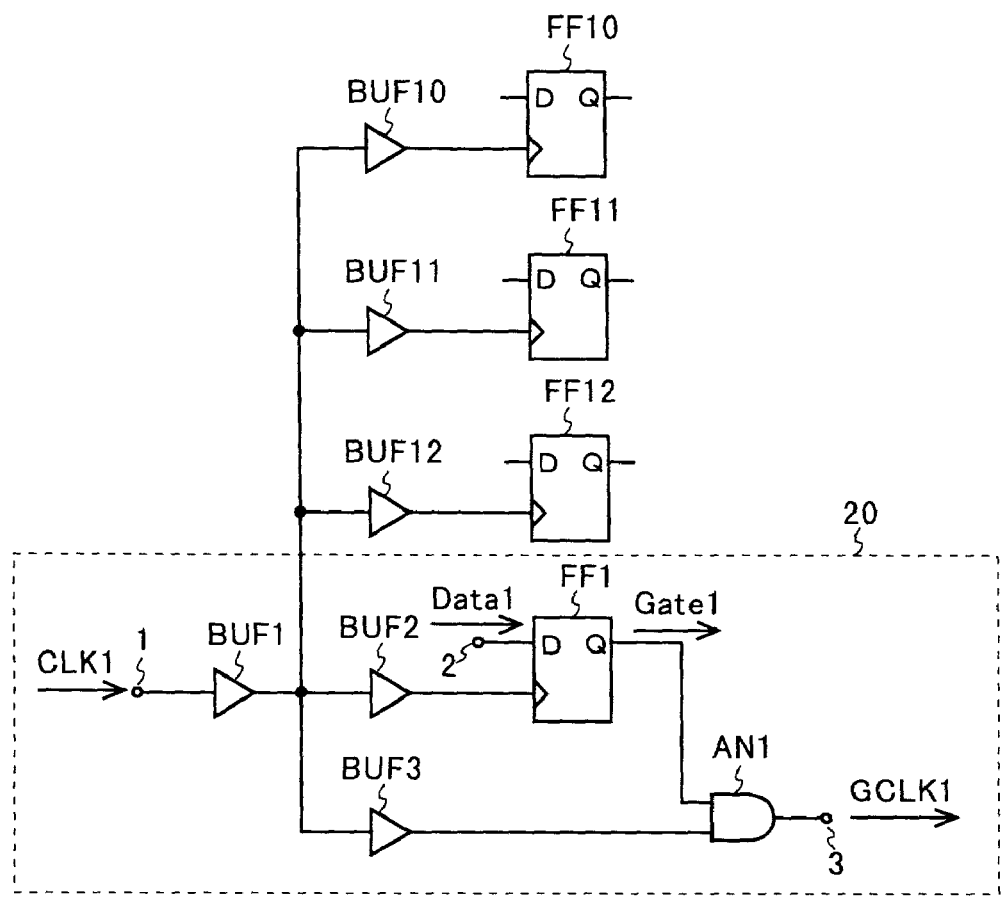
FIG. 19 is a diagram showing the configuration of a clock-synchronous circuit incorporating the gated clock generating circuit of FIG. 14.

FIG. 11A shows the procedure up to the step of adding a flip-flop. First, the input device 11 is fed with the net list of a clock-synchronous circuit incorporating a conventional gated clock generating circuit, for example the net list of a circuit as shown in FIG. 19 (step S10). It is to be noted that, in FIG. 19, such circuit elements and signals as are found also in FIG. 9 are identified with the same symbols. The input device 11 is fed also with the information on at which terminal a clock signal is received, i.e. the information indicating that a clock signal is received at the input terminal 1 (S20).

The data fed to the input device 11 is transferred to the memory 14 by the CPU 16. According to the data transferred to the memory 14, the CPU 16 then searches the net list for circuit elements connected to the terminal at which the clock signal is received, and enumerates the circuit elements constituting it (step S30). Here, buffer gates and inverters are regarded as part of the wiring, and the circuit elements connected beyond them are searched for. Thus, specifically, the flip-flops FF1 and FF10 to FF12 and the AND gate AN1 are enumerated.

Next, the CPU 16 extracts, from the circuit elements enumerated in step S30, those other than the flip-flops receiving the clock signal at their clock input terminals, i.e. only the AND gate AN1 (step S40). In step S40, the AND gate AN1 is identified as the circuit element that generates a gated clock signal on the basis of the clock signal.

Then, the CPU 16 extracts the flip-flop that generates the input signal to the circuit element extracted in step S40, i.e. the flip-flop FF1 (step S50).

Next, the CPU 16 checks whether inversion points of the input signal to the circuit element extracted in step S40 are synchronous with rising edges of the clock signal or not (step S60). Here, the input device 11 may be fed with information indicating whether inversion points of the input signal to the circuit element extracted in step S40 are synchronous with rising edges of the clock signal or not. Alternatively, it is also possible to search for inverters connected between the input terminal at which the clock signal is received and the flip-flops and, on the basis of the number of inverters found, check whether inversion points of the input signal to the circuit element extracted in step S40 are synchronous with rising edges of the clock signal or not.

If inversion points of the input signal to the circuit element extracted in step S40 are synchronous with rising edges of the clock signal ("Yes" in step S60), the CPU 16 takes out a flip-flop from the data stored in the memory 14 beforehand, and adds it to the net list as a new flip-flop that receives the same data input as the flip-flop extracted in step S50 (step S70). The procedure then proceeds to step S90 shown in FIG. 11B.

On the other hand, if inversion points of the input signal to the circuit element extracted in step S40 are synchronous not with rising edges of the clock signal but with its trailing edges ("No" in step S60), the CPU 16 takes out a flip-flop from the data stored in the memory 14 beforehand, and adds it to the net list as a new flip-flop that receives, as its data input, the output of the flip-flop extracted in step S50 (step S80). The procedure then proceeds to step S90 shown in FIG. 11B.

In the particular case under discussion, it was the net list of the circuit of FIG. 19 that was fed in in step S10, and therefore inversion points of the input signal to the AND gate are synchronous with rising edges of the clock signal. Accordingly, the CPU 16 does not execute step S80, but executes step S70. That is, it adds to the net list a new flip-flop that receives the same data input as the flip-flop FF1.

Figure 11B:
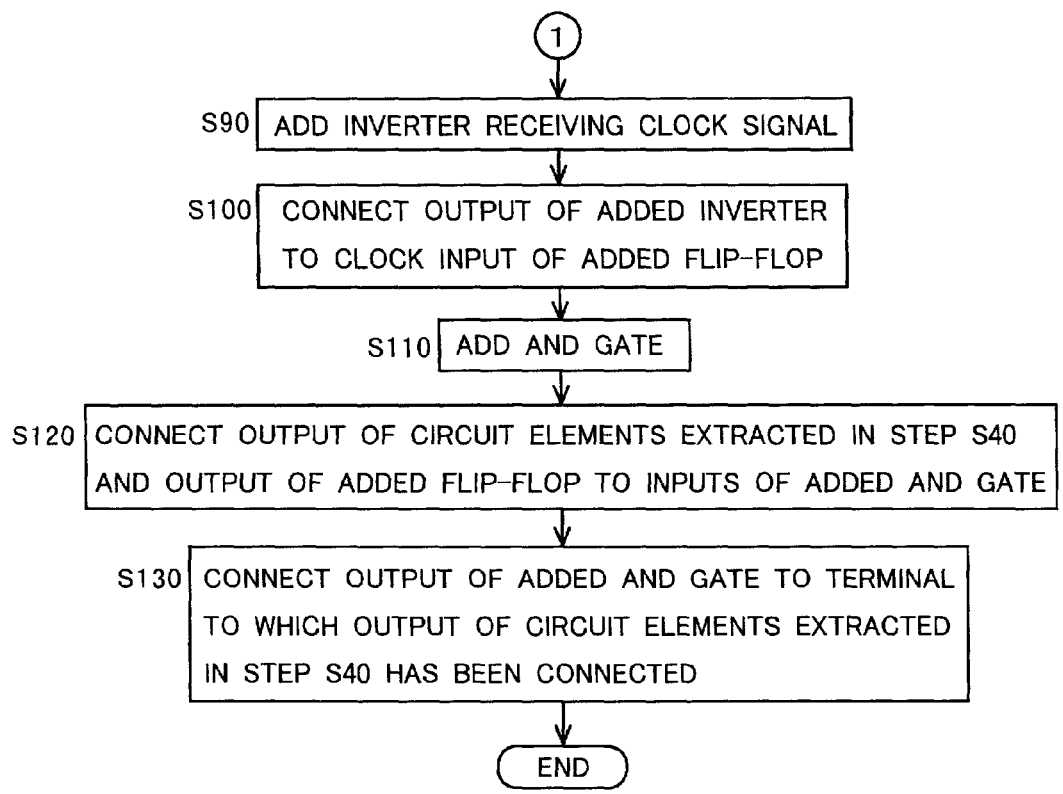
FIG. 11B is a flow chart of the procedure for modifying the net list, showing its portion after the step of adding a flip-flop.

FIG. 11B shows the procedure after the addition of the flip-flop. In step S90, the CPU 16 takes out an inverter from the data stored in the memory 14 beforehand, and adds it to the net list as an inverter that receives the clock signal. Then, the CPU 16 rewrites the net list so that the output of the inverter thus added is connected to the clock input of the flip-flop added in step S70 or S80 (step S100).

Next, the CPU 16 takes out an AND gate from the data stored in the memory 14 beforehand, adds it to the net list (step S110), and rewrites the net list so that the output of the circuit element extracted in step S40 and the output of the flip-flop added in step S70 or S80 are connected to the inputs of the AND gate thus added (step S120).

Then, the CPU 16 rewrites the net list so that the output of the AND gate added in step S110 is connected to the output terminal that has thus far been connected to the output of the circuit element extracted in step S40 (step S130), and ends the procedure. The CPU 16 then stores the net list modified through the procedure as the modified result on the hard disk 13.

As the result of the circuit modifying apparatus of FIG. 10 executing this procedure, the net list of the clock-synchronous circuit of FIG. 19 is modified to the net list of the clock-synchronous circuit of FIG. 9. This permits the designer to design simply a clock-synchronous circuit incorporating a gated clock generating circuit that turns on and off the output of a clock signal on the basis of a single gate signal as conventionally practiced, and thus frees the designer from designing with an increased number of clocks in mind.

However, when a circuit is modified by feeding its net list to the circuit modifying apparatus of FIG. 10 as described above, the modified circuit may turn out to be nonfunctional. For example, in a case where the modified circuit is the clock-synchronous circuit shown in FIG. 9, the data signal fed to the data input terminal of the added flip-flop FF2 there is the data signal Data1 fed to the data input terminal of the flip-flop FF1 in the yet-to-be-modified clock-synchronous circuit shown in FIG. 19. In the yet-to-be-modified clock-synchronous circuit shown in FIG. 19, the data signal Data1 has only to reach the data input terminal of the flip-flop FF1 within one whole period, from one rising edge to the next, of the clock signal CLK1. On the other hand, in the modified clock-synchronous circuit shown in FIG. 9, the data signal Data1 needs to reach the data input terminal of the added flip-flop FF2 within the period from one rising edge to the next trailing edge of the clock signal CLK1. That is, in the modified clock-synchronous circuit shown in FIG. 9, the data signal Data1 needs to reach the flip-flop FF2 within half the period conventionally tolerated. In this way, the restrictions on the delay time are now stricter, and therefore the modified clock-synchronous circuit does not always operate normally.

To avoid this, instead of modifying what has already been put into a circuit diagram, such as circuit diagram information or a net list, it is advisable to execute modification in a description in HDL before it is subjected to logic synthesis. By executing modification in a description in HDL before logic synthesis, it is possible to check whether the restrictions on delay times are met or not during logic synthesis and thereby check whether a circuit so modified operates normally or not. In addition, it is also possible to optimize various aspects, including delay times, of the circuit.

Now, the procedure executed by the circuit modifying apparatus of FIG. 10 when it is fed with a description in HDL before logic synthesis will be described with reference to a flow chart in FIGS. 13A and 13B.

Figure 13A:
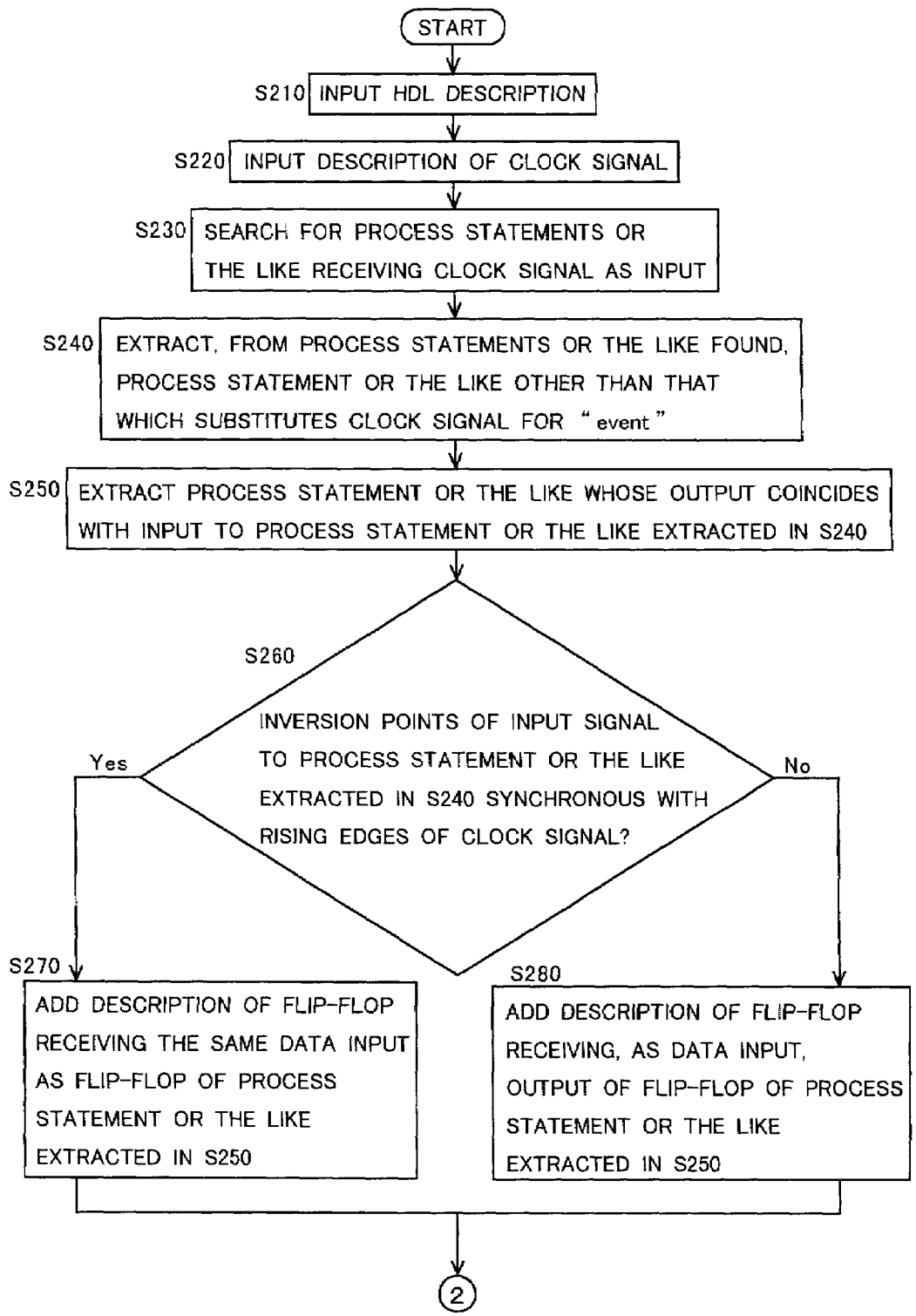
FIG. 13A is a flow chart of the procedure for modifying the description in HDL, showing its portion up to the step of adding a description representing a flip-flop.

FIG. 13A shows the procedure up to the step of adding a description representing a flip-flop. First, the input device 11 is fed with a description in HDL as shown in FIG. 20 which is logically equivalent to, for example, the clock-synchronous circuit shown in FIG. 19 (step S210). In FIG. 20 is shown a description written in VHDL (VHSIC hardware description language), where the portion of the description other than that logically equivalent to the portion 20 of the clock-synchronous circuit of FIG. 19 is omitted. For simplicity's sake, in the following explanation, it is assumed that the portion of the description omitted in FIG. 20 is not dealt with by the procedure.

The input device 11 is then fed with information indicating that "clk1" in the description in HDL represents a clock signal (step S220).

The data fed to the input device 11 is transferred to the memory 14 by the CPU 16. According to the data transferred to the memory 14, the CPU 16 then searches the description in HDL for process statements or concurrent processing statements that use "clk1" as their input, and enumerates them (step S230). As a result, from the description in HDL shown in FIG. 20, the process statement A1 and the concurrent processing statement B1 are found and enumerated.

Next, from the process statements or concurrent processing statements enumerated in step S230, the CPU 16 extracts the process statement or concurrent processing statement other than that which substitutes "clk1" for the description "event" representing edges of a signal (step S240). As a result, the concurrent processing statement B1 alone is extracted. The concurrent processing statement B1 is a description of receiving "clk1" and "gate1" and outputting a gated clock signal "gclk1."

Then, the CPU 16 extracts the process statement or concurrent processing statement that outputs a signal to be used as an input to the process statement or concurrent processing statement extracted in step S240 (step S250). As a result, the process statement A1 that outputs the "gate1" to be used as an input signal to the concurrent processing statement B1 is extracted.

Next, the CPU 16 checks whether edges of the input signal to the process statement or concurrent processing statement extracted in step S240 are synchronous with rising edges of "clk1" or not (step S260). Edges of the input signal to the process statement or concurrent processing statement extracted in step S240 are judged to be synchronous with rising edges of "clk1" if the description around "event" is "clk1' event and clk1='1'" and with trailing edges if the description around "event" is "clk1' event and clk1='0.'"

If edges of the input signal to the process statement or concurrent processing statement extracted in step S240 are synchronous with rising edges of "clk1" ("Yes" in step S260), the CPU 16 checks whether the process statement or concurrent processing statement extracted in step S250 is a description representing only a flip-flop or not. If it includes a description of a circuit other than a flip-flop, the CPU 16 separates it into a description representing only the flip-flop and a description representing the circuit other than the flip-flop.

Then, the CPU 16 extracts a description representing a flip-flop from the data stored in the memory 14 beforehand, and adds it to the description in HDL as a new description representing a flip-flop that receives the same data input as the flip-flop represented by the process statement or concurrent processing statement extracted in step S250 (step S270). The procedure then proceeds to step S290 shown in FIG. 13B.

On the other hand, if edges of the input signal to the process statement or concurrent processing statement extracted in step S240 are synchronous not with rising edges of "clk1" but with trailing edges of "clk1" ("No" in step S260), the CPU 16 checks whether the process statement or concurrent processing statement extracted in step S250 is a description representing only a flip-flop or not. If it includes a description of a circuit other than a flip-flop, the CPU 16 separates it into a description representing only the flip-flop and a description representing the circuit other than the flip-flop.

Then, the CPU 16 extracts a description representing a flip-flop from the data stored in the memory 14 beforehand, and adds it to the description in HDL as a new description representing a flip-flop that receives, as its data input, the output of the flip-flop represented by the process statement or concurrent processing statement extracted in step S250 (step S280). The procedure then proceeds to step S290 shown in FIG. 13B.

In the particular case under discussion, it was the description in HDL of FIG. 20 that was fed in in step S210, and therefore edges of the input signal to the concurrent processing statement B1 extracted in step S240 are synchronous with rising edges of the clock signal. Accordingly, the CPU 16 does not execute step S280, but executes step S270. Specifically, it operates as follows.

Of the description of the process statement A1, the portion other than that representing the flip-flop is separated, and is added as a process statement A2 in FIG. 12. Moreover, a new signal name "data_input_to_ff1" representing a data signal fed to the data input terminal of the flip-flop is introduced. To cope with this, the process statement A1 is modified to a process statement A3 in FIG. 12. That is, the process statement A1 is separated into the process statements A2 and A3 so that the latter after the separation are together logically equivalent to the former before the separation.

Furthermore, a new process statement representing a flip-flop that receives the signal "data_input_to_ff1" at its data input terminal is added to the description in HDL. These are the operations specifically performed in step 270.

Figure 13B:
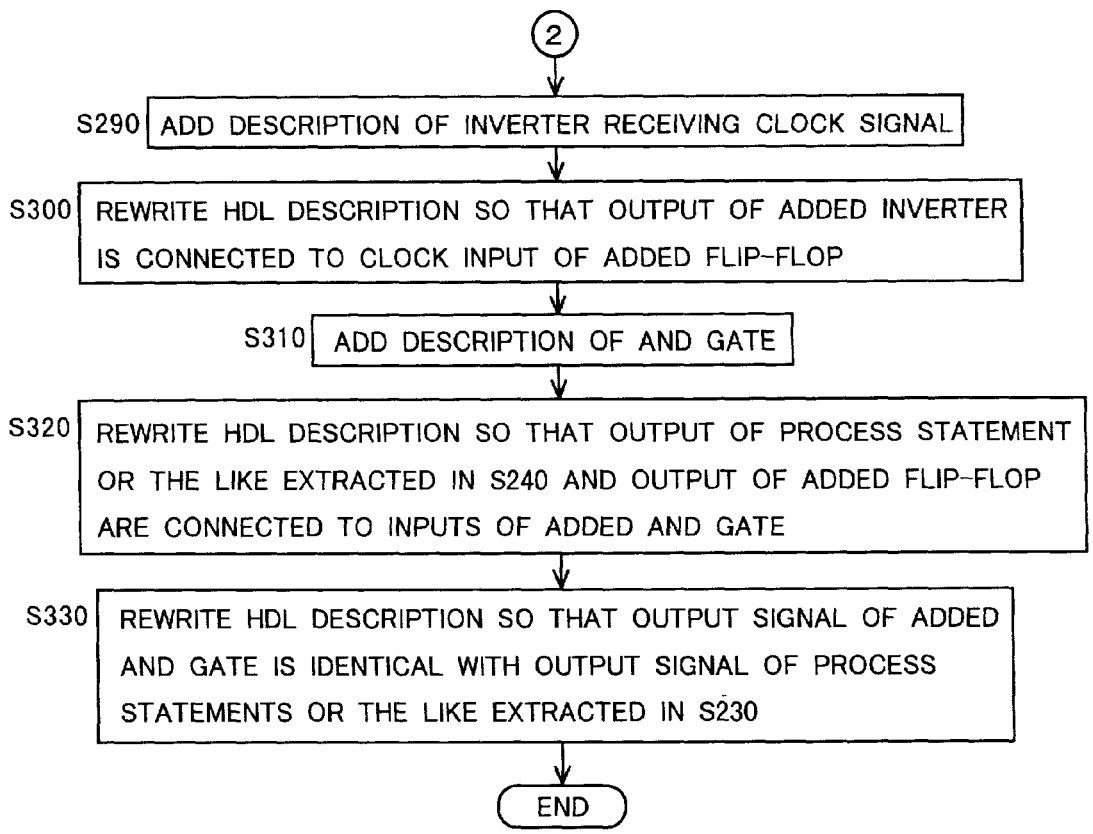
FIG. 13B is a flow chart of the procedure for modifying the description in HDL, showing its portion after the step of adding a description representing a flip-flop.

FIG. 13B shows the procedure after the addition of the description representing the flip-flop. In step S290, the CPU 16 takes out a description representing an inverter from the data stored in the memory 14 beforehand, and adds it to the description in HDL as a description representing an inverter that receives the clock signal. Specifically, the CPU 16 introduces a new signal name "inv_clk1," and adds to the description in HDL a new concurrent processing statement B2 shown in FIG. 12.

Then, the CPU 16 rewrites the description in HDL so that the output of the inverter represented by the description thus added is connected to the clock input terminal of the flip-flop represented by the description added in step S270 or S280 (step S300). Specifically, the signal "inv_clk1" is introduced into "event" in the process statement added in step S270 or S280, and thus a process statement A4 shown in FIG. 12 is created.

Next, the CPU 16 takes out a description representing an AND gate from the data stored in the memory 14 beforehand, and adds it to the description in HDL (step S310).

Moreover, the CPU 16 rewrites the description in HDL, by introducing a new signal name "gate1_tmp," so that the output of the process statement or concurrent processing statement extracted in step S240 and the output of the flip-flop represented by the description added in step S270 or S280 are connected to the inputs of the AND gate represented by the description thus added (step S320). As a result, the process statement B1 is modified to a concurrent processing statement B3 shown in FIG. 12.

Then, the CPU 16 rewrites the description in HDL so that the output signal of the AND gate represented by the description added in step S310 is identical with the output signal of the process statement or concurrent processing statement extracted in step S230 (step S330), and ends the procedure. As a result, the description added in step S310 becomes a concurrent processing statement B4 shown in FIG. 12.

Furthermore, the CPU 16 stores the description in HDL modified through the procedure as the modified result on the hard disk 13. As the result of the circuit modifying apparatus of FIG. 10 executing this procedure, the description in HDL shown in FIG. 20 is modified to the description in HDL shown in FIG. 12. The description in HDL shown in FIG. 12 represents the clock-synchronous circuit of FIG. 9. It is to be noted that, in the description in HDL shown in FIG. 12, the portion other than that logically equivalent to the portion 21 of the clock-synchronous circuit of FIG. 9 is omitted.

Thereafter, when the description in HDL thus modified is subjected to logic synthesis, the designer, by performing the logic synthesis with adequate restrictions imposed on delay times, can check whether the clock-synchronous circuit as a whole, including the added circuit elements, operates normally or not. Moreover, when the clock-synchronous circuit is found to operate normally, the designer can make adjustments in terms of not only delay times but also other restricting factors such as the fan-out and signal transition times. This permits logic synthesis of a clock-synchronous circuit that is more likely to operate as designed than when designed by the use of circuit information or a net list, and thus enhances the reliability of the clock-synchronous circuit so designed.

What is claimed is:

1. A gated clock generating circuit comprising:
   a first gate signal generating circuit that receives a continuously pulsating clock signal and that generates a first gate signal having inversion points synchronous with edges of the clock signal;
   a second gate signal generating circuit that generates a second gate signal deviated by half a period of the clock signal at the inversion points of the first gate signal; and
   an output control circuit that receives the first and second gate signals and the clock signal, and outputs a gated clock signal by switching the clock signal on and off in accordance with the first and second gate signals.

2. A gated clock generating circuit as claimed in claim 1, wherein the first gate signal generating circuit receives a data signal, and generates the first gate signal by delaying the data signal in accordance with the clock signal so that inversion points of the data signal are synchronous with edges of the clock signal.

3. A gated clock generating circuit as claimed in claim 2, wherein the first gate signal generating circuit generates the first gate signal so that the inversion points of the first gate signal are synchronous with rising edges of the clock signal.

4. A gated clock generating circuit as claimed in claim 3, wherein the second gate signal generating circuit receives the clock signal and the data signal, and generates the second gate signal by delaying the data signal in accordance with the clock signal.

5. A gated clock generating circuit as claimed in claim 2, wherein the first gate signal generating circuit generates the first gate signal so that the inversion points of the first gate signal are synchronous with trailing edges of the clock signal.

6. A gated clock generating circuit as claimed in claim 5, wherein the second gate signal generating circuit receives the clock signal and the first gate signal, and generates the second gate signal by delaying the first gate signal in accordance with the clock signal.

7. A gated clock generating circuit as claimed in claim 3, wherein the output control circuit outputs an AND of the first gate signal, the second gate signal, and the clock signal.

8. A gated clock generating circuit as claimed in claim 4, wherein the output control circuit outputs an AND of the first gate signal, the second gate signal, and the clock signal.

9. A gated clock generating circuit as claimed in claim 5, wherein the output control circuit outputs an AND of the first gate signal, the second gate signal, and the clock signal.

10. A gated clock generating circuit as claimed in claim 6, wherein the output control circuit outputs an AND of the first gate signal, the second gate signal, and the clock signal.

* * * * *